ated under 35

United States Patent
Kawasaki et al.

(10) Patent No.: US 7,820,959 B2
(45) Date of Patent: Oct. 26, 2010

(54) PHOTODETECTOR INCLUDING ENHANCED LIGHT RECEIVING PORTION

(75) Inventors: Ryoichi Kawasaki, Gunma (JP); Kenichirou Kawabuchi, Kanagawa (JP)

(73) Assignees: Sanyo Electric Co., Ltd., Osaka (JP); Sanyo Optec Design Co., Ltd., Tokyo (JP)

( * ) Notice: Subject to any disclaimer, the term of this patent is extended or adjusted under 35 U.S.C. 154(b) by 27 days.

(21) Appl. No.: 11/839,864

(22) Filed: Aug. 16, 2007

(65) Prior Publication Data
US 2008/0054157 A1    Mar. 6, 2008

(30) Foreign Application Priority Data
Aug. 30, 2006  (JP)  ............... 2006-233470

(51) Int. Cl.
*H01J 40/14*  (2006.01)
(52) U.S. Cl. .................. 250/239; 250/216; 250/551; 257/81; 369/112.23
(58) Field of Classification Search .......... 250/239, 250/216, 551; 257/81; 362/553, 281.9; 369/112.01, 369/112.08, 112.13, 112.2, 112.23; 360/281.9
See application file for complete search history.

(56) References Cited

U.S. PATENT DOCUMENTS 6,181,720 B1 * 1/2001 Kanemoto et al. ....... 372/43.01
6,664,998 B1 * 12/2003 Kyoya et al. ............ 347/241
2003/0020076 A1 * 1/2003 Yoneda et al. ............ 257/81
2003/0102496 A1 * 6/2003 Kuhara et al. ............ 257/233
2003/0142984 A1 * 7/2003 Masuda et al. ........... 398/115
2003/0174619 A1 * 9/2003 Itonaga .................. 369/53.28
2005/0122861 A1 * 6/2005 Park et al. ............... 369/44.37
2006/0239311 A1 * 10/2006 Kume et al. ........... 372/29.022

FOREIGN PATENT DOCUMENTS

JP          06232445 A   *   8/1994
JP          08194138 A   *   7/1996
JP          2006-172605        6/2006

* cited by examiner

Primary Examiner—Thanh X Luu
Assistant Examiner—Kevin Wyatt
(74) Attorney, Agent, or Firm—Fish & Richardson P.C.

(57) ABSTRACT

A photodetector to be incorporated in an optical pickup device, comprising: a photodiode that a laser light emitted from a laser diode is applied to and that outputs a signal corresponding to light amount of the laser light; and a translucent resin member configured to cover the photodiode, including a light receiving portion that the laser light is applied to and that causes the laser light to be applied to the photodiode, and a peripheral portion provided around the light receiving portion, the light receiving portion being smaller in thickness than the peripheral portion.

4 Claims, 4 Drawing Sheets

PHOTODETECTOR INCLUDING ENHANCED LIGHT RECEIVING PORTION

CROSS-REFERENCE TO RELATED APPLICATION

This application claims the benefit of priority to Japanese Patent Application No. 2006-233470, filed Aug. 30, 2006, of which full contents are incorporated herein by reference.

BACKGROUND OF THE INVENTION

1. Field of the Invention

The present invention relates to a photodetector used in a form incorporated in an optical pickup device that performs an operation of reading out a signal recorded in an optical disc or recording a signal in an optical disc.

2. Description of the Related Art

There is widely used an optical disc device capable of applying the laser light emitted from an optical pickup device to a signal recording layer of an optical disc thereby performing an operation of reading out and recording a signal.

While the optical disc device for use with the optical disc such as CD and DVD is generally in wide use, recently the optical disc device has been developed, for use with the optical disc with improved recording density, namely, the optical disc of Blu-ray standard or HD-DVD (High Definition Digital Versatile Disc) standard.

An infrared light with a wavelength of 780 nm is used as the laser light for the operation of reading out a signal recorded in the optical disc of the CD standard, and a red light with a wavelength of 650 nm is used as the laser light for the operation of reading out a signal recorded from the optical disc of the DVD standard.

As compared to the above optical discs of the CD standard and the DVD standard, the laser light with a shorter wavelength, e.g., a blue light with a wavelength of 405 nm is used as the laser light for the operation of reading out a signal recorded in the optical disc of the Blu-ray standard or the HD-DVD standard.

There is provided a protective layer with a thickness of 0.1 mm on the top surface of the signal recording layer of the optical disc of the Blu-ray standard, and the numerical aperture of an objective lens is set at 0.85 for use in performing the operation of reading out a signal from the signal recording layer.

On the other hand, there is provided a protective layer with a thickness of 0.6 mm on the top surface of the signal recording layer of the optical disc of the HD-DVD standard, and the numerical aperture of the objective lens is set at 0.65 for use in performing the operation of reading out a signal from the signal recording layer.

As described above, since the blue light with a wavelength of 405 nm can be used as the laser light for performing the operation of reading out signals recorded in the optical discs of the Blu-ray standard and the HD-DVD standard, there can be produced the optical pickup device capable of performing the operation of reading out signals from the optical discs of these two standards, by using a laser diode in common for both optical discs.

However, in order to read out signals from both optical discs, the numerical aperture needs to be changed correspondingly to each of the optical discs, since both optical discs are largely different in the positions of the signal recording layers and in the numerical aperture required of the objective lens. There has been developed the optical pickup device capable of performing the above operation (see Japanese Patent Application Laid-Open Publication No. 2006-172605).

The optical pickup device conforming to the optical disc standards where the recording density is to be improved, requires high optical properties to enhance signal recording quality in accordance with the improvement of the recording density.

The optical pickup device is configured to be able to control a driving current that is supplied to the laser diode, so that the laser outputs can be obtained, which is suitable for reading out a signal recorded in the optical disc or which is suitable for recording a signal in the optical disc.

The optical pickup device is also configured to be able to perform: a control of focusing the laser light emitted from the optical pickup device on the signal recording layer of the optical disc, namely, a focusing control operation; and a control of causing the focusing spot of the laser light to follow a signal track, namely, a tracking control operation.

The photodetector is incorporated in the optical pickup device as a means for the laser output control operation, the focusing control operation, and the tracking control operation, described above.

The photodetector incorporated in the optical pickup device will be described with reference to FIG. 4. FIG. 4 is a cross-sectional view of the photodetector. A photodiode 2 that outputs a signal corresponding to light amount of the received laser light is fixed on a substrate 1, and also the photodiode 2 is covered by a translucent resin member 3 having high transmittance. While a signal generated by the photodiode 2 is taken out through a wire bonding, such a wire is fixed and protected by the translucent resin member 3.

The laser light used for the DVD-type optical disc, namely, the red laser light, has a wavelength of 650 nm, while the laser light used for the optical disc of the Blu-ray or HD-DVD standard, namely, the blue laser light, has a shorter wavelength of 40.5 nm.

The relationship between the energy and the wavelength of the laser light is expressed as $E=h\nu=h \times c/\lambda$ where E is energy, h is Planck's constant, $\nu$ is the number of vibrations, c is light speed, and $\lambda$ is wavelength. As is apparent from the above relationship, the laser light has the characteristics that the shorter the wavelength of the laser light becomes, the higher the light energy becomes.

In the optical pickup device incorporating the laser diode that emits the laser light, while the laser output control operation is performed utilizing a signal obtained from the photodetector, the operation of detecting light amount of the laser light is performed by the photodetector based on the laser light emitted through the translucent resin member 3 that covers the photodiode 2.

In view of performance and cost, epoxy resin is generally used as a material of the translucent resin member 3. In the case of using resins, however, since the transmittance continues to fall due to a photochemical reaction, the laser output for reproducing and the laser output for recording change. Especially in the case of performing the recording operation, since the laser output control operation is required to be performed precisely according to the recording characteristics of the optical disc, there is a problem that the recording operation can not be performed precisely when the detecting operation is not precisely performed by the photodetector due to the fall of the transmittance.

Although there is a method of covering the photodiode 2 with glass for solving the above problem, such a method causes a problem that the price of the optical pickup device increases due to a high cost of glass. When the photodetector having the photodiode 2 covered with the above translucent resin member 3 is employed for the optical pickup device that uses the blue laser light, since light energy of the laser light is high, the photochemical reaction of the resin is strong, which causes the transmittance of light receiving portion 3a to be fallen. As a result, such a problem occurs that the performance of the optical pickup device can not be maintained for a long time.

SUMMARY OF THE INVENTION

A photodetector to be incorporated in an optical pickup device according to an aspect of the present invention, comprises: a photodiode that a laser light emitted from a laser diode is applied to and that outputs a signal corresponding to light amount of the laser light; and a translucent resin member configured to cover the photodiode, including a light receiving portion that the laser light is applied to and that causes the laser light to be applied to the photodiode, and a peripheral portion provided around the light receiving portion, the light receiving portion being smaller in thickness than the peripheral portion.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which.

DETAILED DESCRIPTION OF THE INTENTION

At least the following details will become apparent from descriptions of this specification and of the accompanying drawings.

Figure 1:
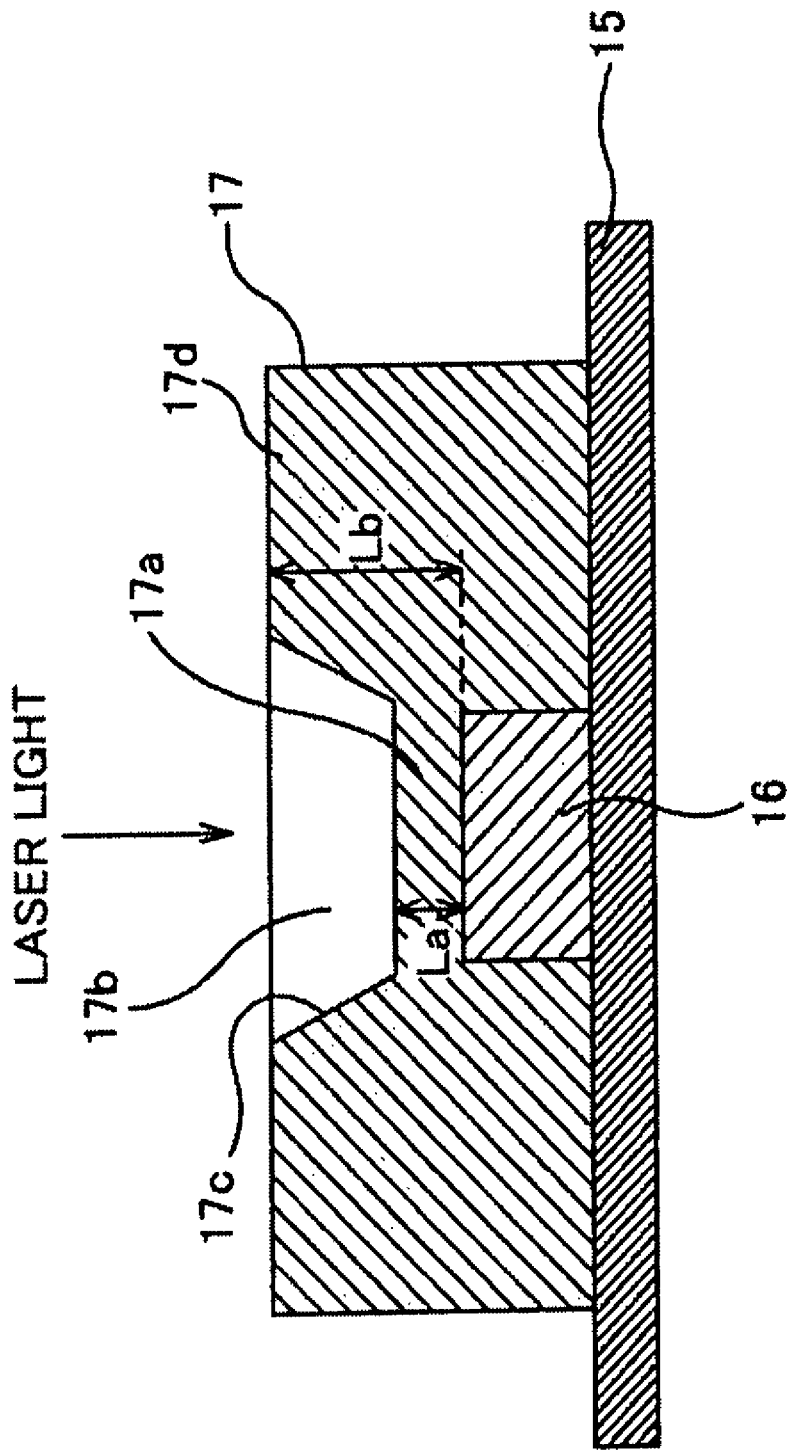
FIG. 1 is a cross-sectional view of a photodetector according to an embodiment of the present invention.
Figure 2:
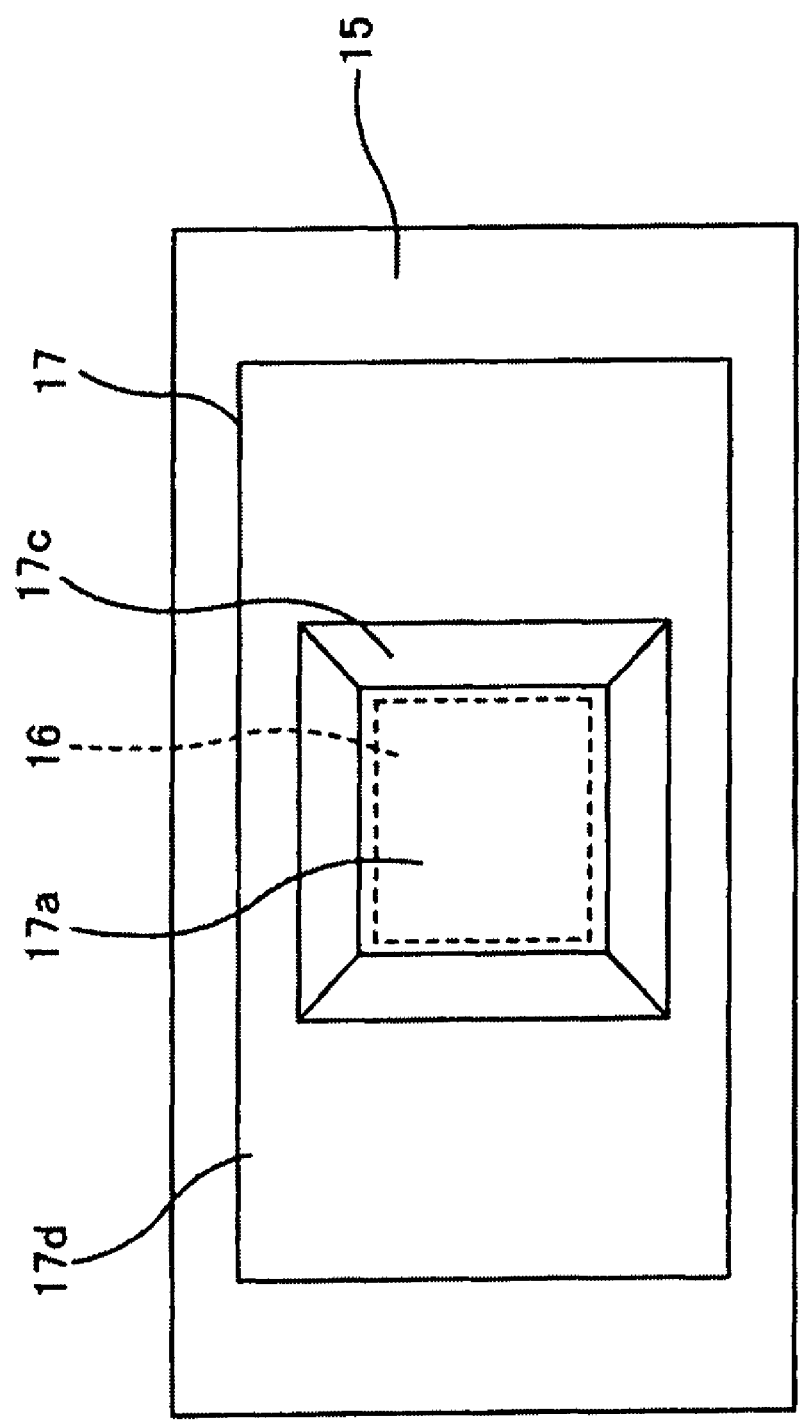
FIG. 2 is a plan view of the photodetector shown in FIG. 1.
Figure 3:
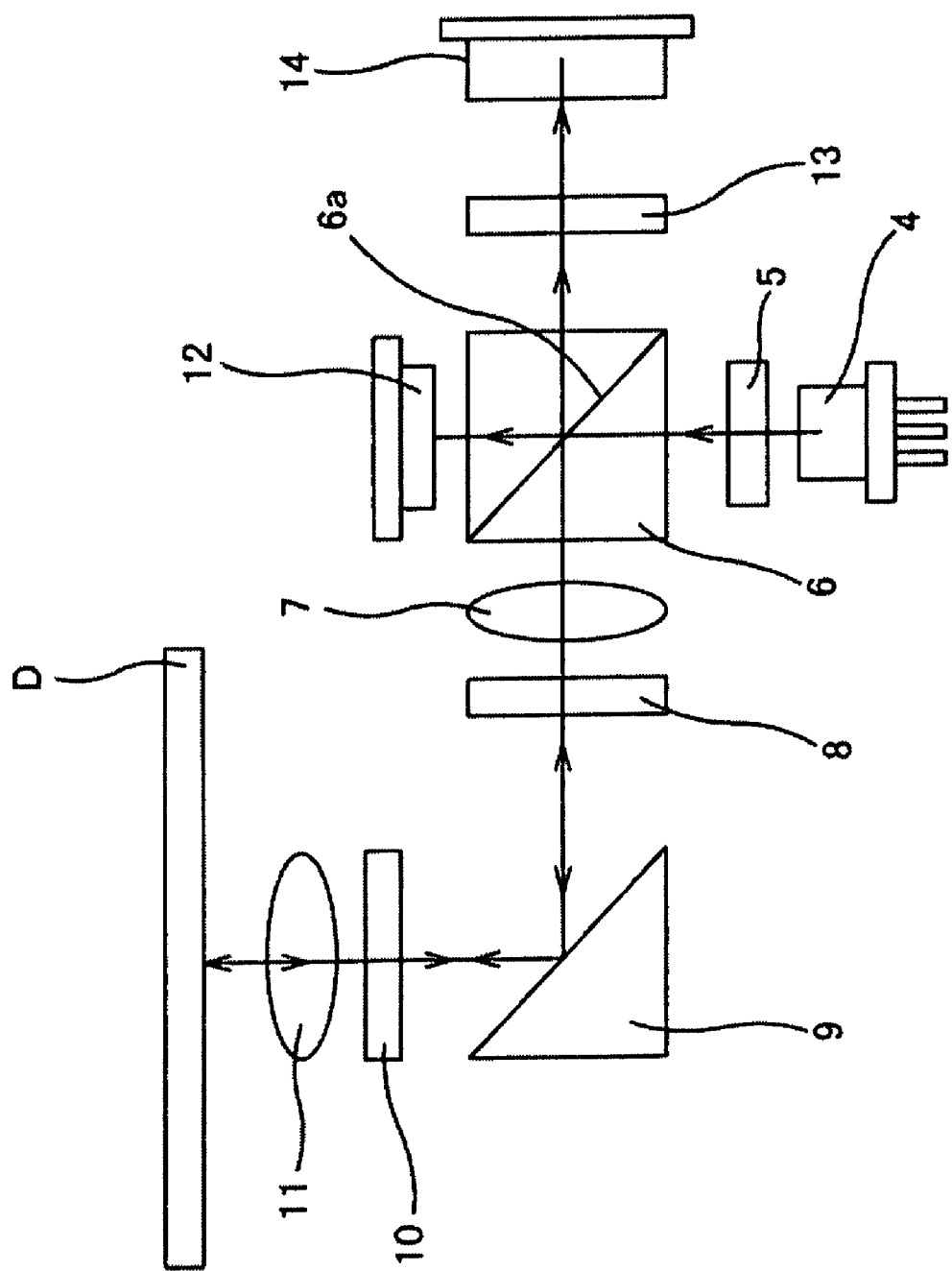
FIG. 3 is a block diagram of essential parts of an optical pickup device incorporating the photodetector according to an embodiment of the present invention.
Figure 4:
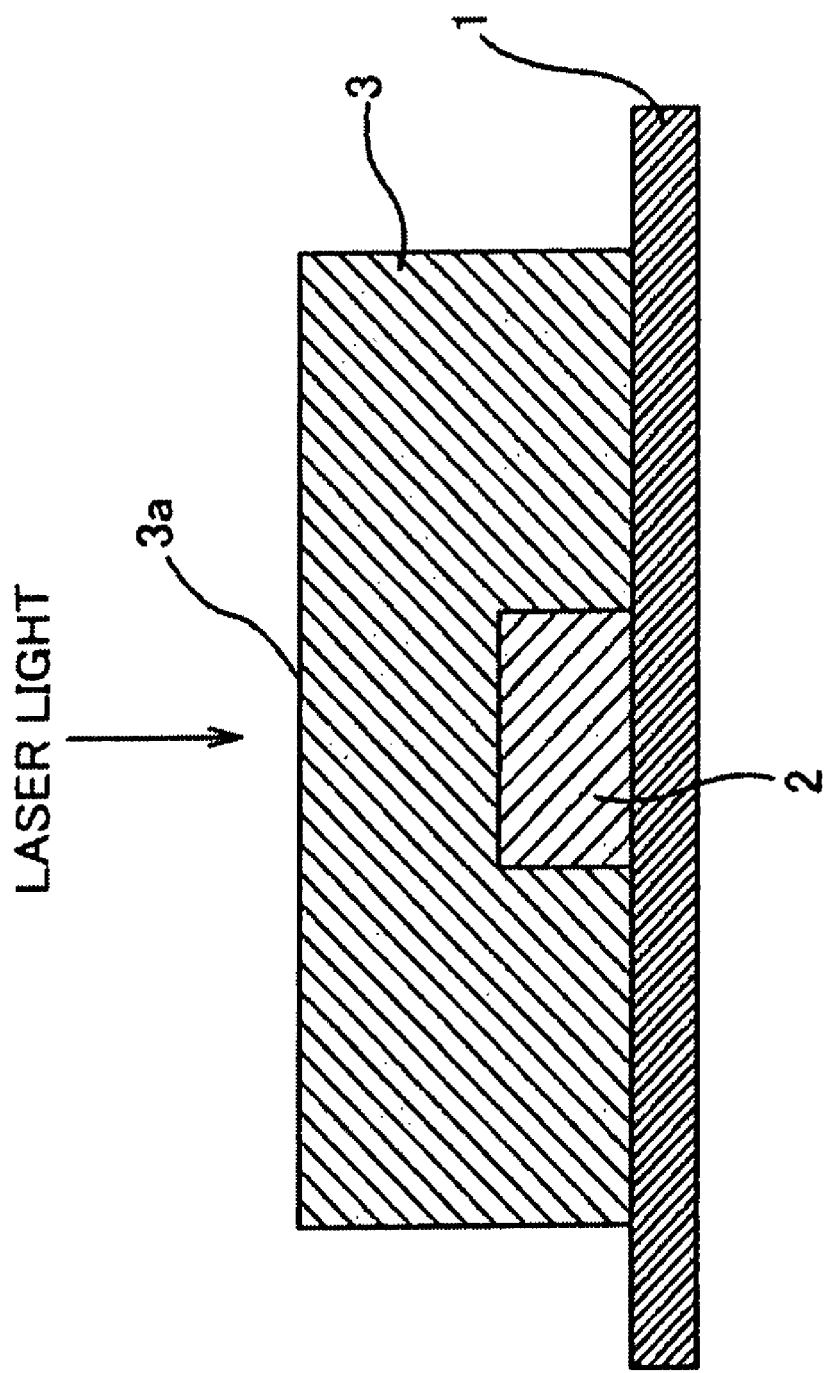
FIG. 4 is a cross-sectional view of the photodetector.

FIG. 1 is a cross-sectional view of a photodetector according to an embodiment of the present invention, FIG. 2 is a plan view of the photodetector according to an embodiment of the present invention, and FIG. 3 is a block diagram of essential parts of an optical pickup device incorporating the photodetector according to an embodiment of the present invention.

A configuration of the optical pickup device will be described with reference to FIG. 3. In FIG. 3, reference numeral 4 represents a laser diode that emits a blue laser light and reference numeral 5 represents a diffraction grating that the laser light from the laser diode 4 is applied to and that has a function of separating the laser light into 0th-order light, +1st-order light, and −1st-order light.

Reference numeral 6 represents a polarizing beam splitter that the laser light from the diffraction grating 5 is applied to, and that a reflected light from the optical disc D to be described later is applied to, and that has a function of transmitting an incident laser light or reflecting the laser light at a reflective layer 6a. Reference numeral 7 represents a collimating lens that the laser light reflected by the polarizing beam splitter 6 is applied to and that has a function of converting the incident laser light to a parallel light.

Reference numeral 8 represents a phase change member that the laser light converted to the parallel light at the collimating lens 7 is applied to and that selectively changes the phase of the incident laser light by ½λ (λ indicates wavelength). For example, as described in the patent reference 1, the phase change member 8 for which a liquid crystal is used, can be configured so as to change the phase with the aid of an orientational change of alignment of liquid crystal molecule by controlling a supply operation of a power supply. The phase change member 8 is configured not only so as to perform a function of converting an incident P wave into an S wave by changing the phase of the laser light emitted from the laser diode 4 but also so as to set an effective luminous flux diameter of the laser light.

Reference numeral 9 represents a reflecting mirror that changes the direction of the laser light having passed through the phase change member 8 to a signal surface of the disc D, and also has a function of reflecting the reflected light from the disc D, in the direction of the phase change member 8. Reference numeral 10 represents a hologram element that the laser light reflected by the reflecting mirror 9 is applied to and that diffracts the incident laser light according to the phase of the laser light. The hologram element can be configured, for example, as described in the patent reference 1, and then is configured, for example, so as to allow the incident laser light to pass therethrough as it is in the P-wave case and so as to diffract the incident laser light in the S-wave case.

Reference numeral 11 represents an objective lens that the laser light having passed through the hologram element 10 is applied to and that has a function of focusing the incident laser light on the signal recording layer of the optical disc D. In the above configuration, the objective lens 11 is configured: such that the numerical aperture thereof is set at 0.85 when the P-wave laser light with its effective luminous flux diameter set by the phase change member 8 is applied to the hologram element 10; and such that the numerical aperture thereof is set at 0.65 when the S-wave laser light with its effective luminous flux diameter set by the phase change member 8 is applied to the hologram element 10.

Therefore, when the optical disc D is the optical disc of the Blu-ray standard, the operation of reading out a signal recorded in the optical disc D can be performed: by guiding the laser light emitted from the laser diode 4 to the hologram element 10 as the P-wave laser light with its effective luminous flux diameter set by the phase change member 8; and by setting the numerical aperture of the objective lens at 0.85.

When the optical disc D is the optical disc of the HD-DVD standard, the operation of reading out a signal recorded in the optical disc D can be performed: by guiding the laser light emitted from the laser diode 4 to the hologram element 10 as the S-wave laser light with its the phase has been changed and the effective luminous flux diameter set by the phase change member 8; and by setting the numerical aperture of the objective lens at 0.65.

The signal reading operation in the optical pickup device is performed as described above, and then there will be described hereinafter the photodetector used for the laser output control operation and for the focusing control operation and the tracking control operation in the optical pickup device.

In FIG. 3, reference numeral 12 represents the photodetector for the laser output control which is provided in a position that the laser light emitted from the laser diode 4 partially passing through the polarizing bean splitter 6 is to be applied to, and which incorporates a photodiode 16. The above photodetector 12 for the laser output control is configured so as to generate a signal corresponding to the light amount of the incident laser light and, by feeding back the signal obtained as above to a laser driving circuit, the laser output control operation, namely, a laser servo operation, can be performed.

In the optical pickup device described above, the laser light reflected by the optical disc D and applied to the polarizing beam splitter 6 through the objective lens 11, the hologram element 10, the reflecting mirror 9, the phase change member 8, and the collimating lens 7, passes through the polarizing beam splitter 6, as it is, without being reflected by the reflective layer 6a. The reference numeral 13 represents a sensor lens provided in a position that the reflected light from the optical disc D passing through the polarizing beam splitter 6 is to be applied to. The sensor lens 13 performs a function of guiding the laser light to a control-use photodetector 14 used for the focusing control operation and the tracking control operation.

The control-use photodetector 14 incorporates a plurality of photodiodes in a shape called 4-divided sensor, which is well-known, and it is generally called PDIC.

The present invention has a great effect when being implemented in the photodetector incorporated in the optical pickup device described above, for example, the photodetector 12 for the laser output control, and description will be made with reference to FIGS. 1 and 2.

In a photodetector according to an embodiment of the present invention, as shown in the drawings, the photodiode 16 that outputs a signal corresponding to the light amount of the received laser light is fixed onto a substrate 15, and at the same time, the photodiode 16 is covered by a translucent resin member 17 with high transmittance. While a signal generated by the photodiode 16 is taken out through the wire bonding (not shown), such a wire is fixed and protected by the translucent resin member 17.

In the above configuration, while the laser light is applied to the photodiode 16 via the translucent resin member 17, the thickness La of a light receiving portion 17a for receiving the laser light in the translucent resin member 17 is made smaller than the thickness Lb of a peripheral portion 17d of the translucent resin member 17, as shown in the drawing. To be more specific, in FIG. 1, the thickness La of the light receiving portion 17a relative to a laser-light applied surface of the photodiode 16 is made smaller than the thickness Lb of the peripheral portion 17d relative to a dashed line extended in parallel with the substrate 15 from the laser-light applied surface of the photodiode 16. That is, the translucent resin member 17 is formed with a concave portion 17b at a part thereof corresponding to a light receiving portion of the photodiode 16. A peripheral portion 17c that is an inner lateral surface of the concave portion 17b (the periphery of the concave portion) is configured to be inclined toward the light receiving portion 17a. That is, since an open area of the concave portion 17b becomes smaller as it comes closer to the light receiving portion 17a, the laser light is efficiently applied to the photodiode 16. The thickness La formed by providing the concave portion 17b is a thickness for protecting the wire for taking out a signal generated by the photodiode 16.

In a present embodiment, description has been made according to the case of one photodiode 16 incorporated in the photodetector, such as the case of the photodetector for the laser output control. However, since a plurality of photodiodes are provided in the control-use photodetector 14 provided for performing the focusing control operation or the tracking control operation, all that is required in the case of implementing the present embodiment in the control-use photodetector 14 is just to make the thickness of the light receiving portion corresponding to each of the respective photodiodes smaller.

As described above, by making the thickness La of the light receiving portion 17a, to which the laser light is emitted, of the translucent resin member 17 covering the photodiode 16 incorporated in the photodetector smaller than the thickness Lb of the peripheral portion 17d, the effect of the photochemical reaction of the resin can be reduced, and as a result, the performance of the optical pickup device can be maintained for a long time.

When a configuration of FIG. 1 is used as that of the photodetector 12 for performing the laser output control operation in the optical pickup device, the laser output control operation can be performed precisely and for a long time.

The tracking control operation or the focusing control operation can also be performed precisely and for a long time.

The above embodiments of the present invention are simply for facilitating the understanding of the present invention and are not in any way to be construed as limiting the present invention. The present invention may variously be changed or altered without departing from its spirit and encompass equivalents thereof.

That is, while description has been made with reference to an example shown in FIG. 3 as the optical pickup device implementing the photodetector according to an embodiment of the present invention, needless to say, the photodetector according to an embodiment of the present invention can be implemented in an optical pickup device of other configurations and it is not limitative in any manner whatsoever. While the photodetector according to an embodiment of the present invention is implemented in an optical pickup device, it can also be implemented in other devices using laser light.

What is claimed is:

1. A photodetector to be incorporated in an optical pickup device, comprising:
    a photodiode that a laser light emitted from a laser diode is applied to and that outputs a signal corresponding to light amount of the laser light; and
    a translucent resin member configured to cover the photodiode, including
        a light receiving portion that the laser light is applied to and that causes the laser light to be applied to the photodiode, and
        a peripheral portion provided around the light receiving portion,
    wherein:
        a thickness of the light receiving portion between a laser diode-facing surface of the photodiode and a laser diode-facing surface of the light receiving portion is smaller than a thickness of the peripheral portion between the laser diode-facing surface of the photodiode and a laser diode-facing surface of the peripheral portion,
        the laser diode-facing surface of the peripheral portion is closer to the laser diode than the laser diode-facing surface of the light receiving portion,
        the translucent resin member further includes a concave portion that is concave from the laser diode-facing surface of the light receiving portion that the laser light is applied to, to reduce the thickness of the light receiving portion between the laser diode-facing surface of the photodiode and the laser diode-facing surface of the light receiving portion, the laser diode-facing surface of the light receiving portion is located between the laser diode-facing surface of the photodiode and the laser diode-facing surface of the peripheral portion, the laser diode-facing surface of the light receiving portion is parallel to the laser diode-facing surface of the photodiode, and a periphery of the concave portion is inclined toward the light receiving portion so that an open area of the concave portion becomes smaller toward the laser diode-facing surface of the light receiving portion from the laser diode-facing surface of the peripheral portion.

2. The photodetector of claim 1, wherein the laser light emitted from the laser diode is applied to the photodetector, and the photodetector is used for an operation of output control of the laser diode.

3. The photodetector of claim 1, wherein laser light reflected from a signal surface of an optical disc is applied to the photodetector, and the photodetector is used for a tracking control operation and/or a focusing control operation of the optical pickup device.

4. The photodetector of claim 1, wherein the laser light emitted from the laser diode is a blue laser light.

* * * * *